(12) United States Patent
Astley et al.

(10) Patent No.: US 9,886,143 B2
(45) Date of Patent: Feb. 6, 2018

(54) MULTI-FUNCTION SENSING APPARATUS

(71) Applicant: Nokia Technologies Oy, Espoo (FI)

(72) Inventors: Michael Astley, Waterbeach (GB); Darryl Cotton, Cambs (GB); Jani Kivioja, Cambourne (GB)

(73) Assignee: Nokia Technologies Oy, Espoo (FI)

( * ) Notice: Subject to any disclaimer, the term of this patent is extended or adjusted under 35 U.S.C. 154(b) by 604 days.

(21) Appl. No.: 14/497,885

(22) Filed: Sep. 26, 2014

(65) Prior Publication Data

US 2015/0097581 A1 Apr. 9, 2015

(30) Foreign Application Priority Data

Oct. 3, 2013 (GB) .................................. 1317540.1

(51) Int. Cl.
*G06F 3/044* (2006.01)
*G01R 27/26* (2006.01)
(Continued)

(52) U.S. Cl.
CPC ......... *G06F 3/044* (2013.01); *G01R 27/2605* (2013.01); *G06F 3/0362* (2013.01); *H03K 17/955* (2013.01); *H03K 17/962* (2013.01); *G06F 2203/04106* (2013.01); *H03K 2017/9602* (2013.01); *H03K 2217/960755* (2013.01)

(58) Field of Classification Search
CPC .. G01V 3/102; G01N 33/442; G01R 27/2611; G01R 33/063; G01R 27/2605; G06F 3/044; G06F 3/0362; G06F 2203/04106; H03K 17/955; H03K 17/962

USPC ........... 324/200, 207.13–247, 686–688, 600, 324/529–530, 500, 519, 750.17, 754.28, 324/548, 658

See application file for complete search history.

(56) References Cited

U.S. PATENT DOCUMENTS 7,279,647 B2 10/2007 Philipp
2008/0111714 A1* 5/2008 Kremin ................... G06F 3/044
341/33

(Continued)

FOREIGN PATENT DOCUMENTS

EP 2296083 A2 3/2011
WO 2008/009687 A1 1/2008
(Continued)

OTHER PUBLICATIONS

Fraden, "Capacitance-To-Voltage Converters", Handbook of Modern Sensors, Edition 4, Chapter 5, 2010, pp. 208-210.
(Continued)

*Primary Examiner* — Melissa Koval
*Assistant Examiner* — Trung Nguyen
(74) *Attorney, Agent, or Firm* — Harrington & Smith

(57) ABSTRACT

An apparatus includes a capacitance touch sensor arrangement configured to have a variable capacitance that varies when a conductive object approaches; and at least one variable impedance sensor configured to have a variable impedance that varies with a sensed parameter; an output node; and at least one switch configured to provide, in a first configuration, an output impedance at the output node that depends upon the variable capacitance and configured to provide, in a second configuration, an output impedance at the output node that depends upon the variable impedance.

19 Claims, 3 Drawing Sheets

(51) Int. Cl.
*G06F 3/0362* (2013.01)
*H03K 17/955* (2006.01)
*H03K 17/96* (2006.01)

(56) References Cited

U.S. PATENT DOCUMENTS

| | | |
|---|---|---|
| 2008/0127739 A1 | 6/2008 | DeAngelis et al. |
| 2008/0246723 A1 | 10/2008 | Baumbach |
| 2010/0123667 A1 | 5/2010 | Kim et al. |
| 2010/0149127 A1 | 6/2010 | Fisher et al. |
| 2010/0245246 A1 | 9/2010 | Rosenfeld et al. |
| 2010/0295559 A1 | 11/2010 | Osoinach |
| 2011/0043227 A1 | 2/2011 | Pance et al. |
| 2011/0057899 A1 | 3/2011 | Sleeman et al. |
| 2013/0018489 A1 | 1/2013 | Grunthaner et al. |
| 2013/0033450 A1 | 2/2013 | Coulson et al. |
| 2013/0050139 A1 | 2/2013 | Gute |

FOREIGN PATENT DOCUMENTS

| | | |
|---|---|---|
| WO | 2010/117664 A2 | 10/2010 |
| WO | 2013/005861 A1 | 1/2013 |
| WO | 2013/083736 A1 | 6/2013 |

OTHER PUBLICATIONS

Search Report received for corresponding United Kingdom Patent Application No. 1317540.1, dated Jan. 31, 2014, 3 pages.

International Search Report and Written Opinion received for corresponding Patent Cooperation Treaty Application No. PCT/FI2014/050615, dated Feb. 4, 2015, 16 pages.

Yuji, Junichiro et al., "Temperature and Humidity Sensing Functions of a Capacitive Touch Sensor for Material Discrimination", SICE Annual Conference in Sapporo, Japan, Aug. 4-6, 2004, pp. 2652-2655.

* cited by examiner

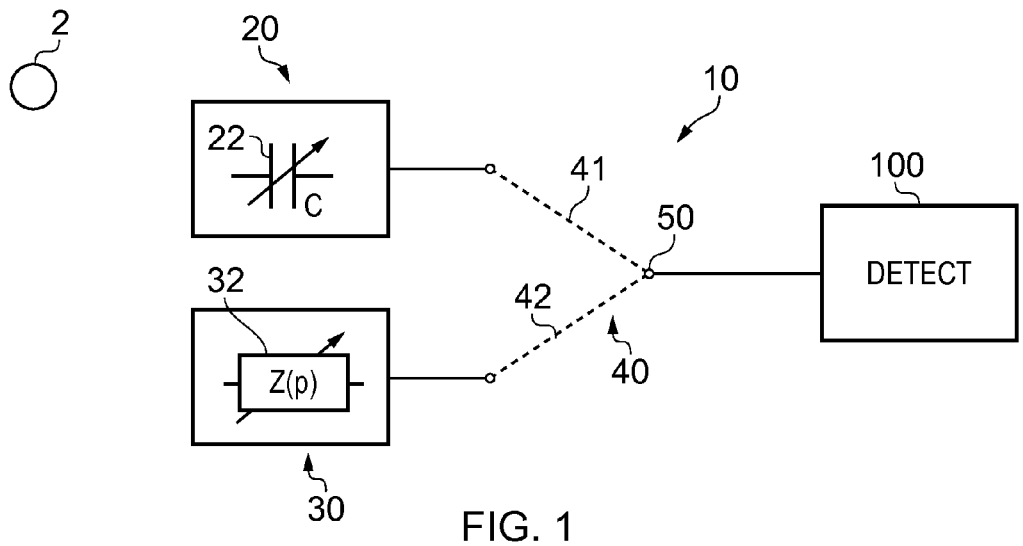
FIG. 1
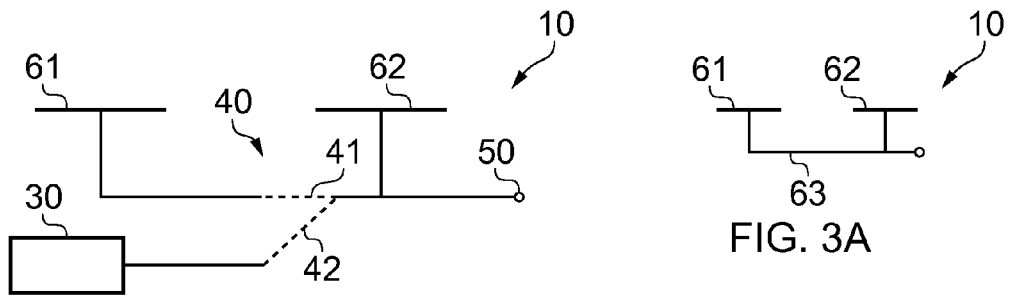
FIG. 2
FIG. 3A
FIG. 3B
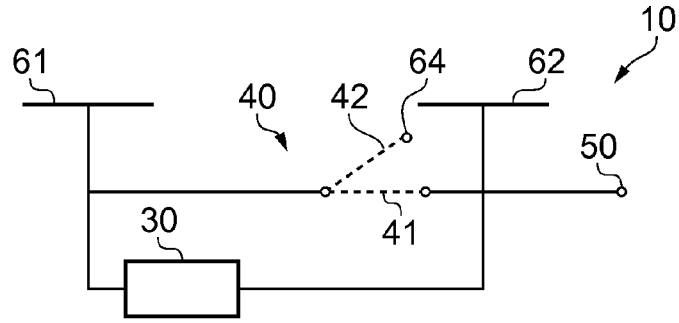
FIG. 4

MULTI-FUNCTION SENSING APPARATUS

TECHNOLOGICAL FIELD

Embodiments of the present invention relate to sensing.

BACKGROUND

A capacitance touch sensor arrangement may be used to detect a user touch.

When a user touches the touch sensor arrangement charge is sourced from or sunk at the user changing the capacitance of the touch sensor arrangement. This enables the touch to be detected.

BRIEF SUMMARY

According to various, but not necessarily all, embodiments of the invention there is provided an apparatus comprising: a capacitance touch sensor arrangement configured to have a variable capacitance that varies when a conductive object approaches; and at least one variable impedance sensor configured to have a variable impedance that varies with a sensed parameter; an output node; and at least one switch configured to provide, in a first configuration, an output impedance at the output node that depends upon the variable capacitance and configured to provide, in a second configuration,
an output impedance at the output node that depends upon the
variable impedance.

According to various, but not necessarily all, embodiments of the invention there is provided an apparatus comprising: a first electrode, a second electrode configured to provide an output signal, a switch configured to switch between a first configuration and a second configuration, wherein when the switch switches from the second configuration to the first configuration, it reduces the impedance between the first electrode and the second electrode,
wherein, when the switch is in the first configuration, the first and second electrodes form a capacitance touch sensor arrangement configured to have a variable capacitance that varies when a conductive object approaches;
and wherein, when the switch is in the second configuration, the first and second electrodes form a variable impedance sensor configured to have a variable impedance that varies with a sensed parameter.

According to various, but not necessarily all, embodiments of the invention there is provided a method comprising: performing proximity detection by controlling switching of an apparatus comprising: a capacitance touch sensor arrangement configured to have a variable capacitance that varies when a conductive object approaches; and at least one variable impedance sensor configured to have a variable impedance that varies with a sensed parameter; and an output node, to a first configuration in which an output impedance at the output node depends upon the variable capacitance; and sensing a parameter by controlling switching of the apparatus to a second configuration in which an output impedance at the output node depends upon the variable the variable impedance.

BRIEF DESCRIPTION

For a better understanding of various examples that are useful for understanding the brief description, reference will now be made by way of example only to the accompanying drawings in which:

FIG. 1 illustrates an example of an multi-function sensing apparatus;

FIG. 2 illustrates an example of an multi-function sensing apparatus;

FIG. 3A illustrates schematically the apparatus of FIG. 2 when the switch is in the first configuration;

FIG. 3B illustrates schematically the apparatus of FIG. 2 when the switch is in the second configuration;

FIG. 4 illustrates an example of an multi-function sensing apparatus;

DETAILED DESCRIPTION

Figure 5:
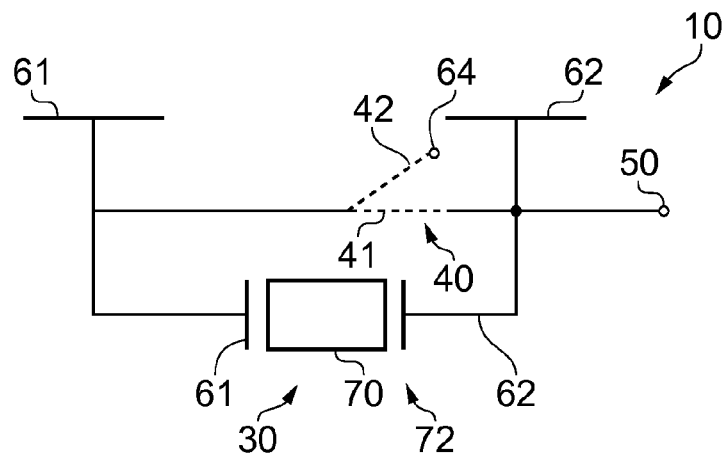
FIG. 5 illustrates an example of an multi-function sensing apparatus.

The Figures illustrate a sensing apparatus 10 comprising: a capacitance touch sensor arrangement 20 configured to have a variable capacitance 22 that varies when a conductive object 2 approaches; and at least one variable impedance sensor 30 configured to have a variable impedance 32 that varies with a sensed parameter p; an output node 50; and at least one switch 40 configured to provide, in a first configuration, an output impedance at the output node 50 that depends upon the variable capacitance 22 and configured to provide, in a second configuration, an output impedance at the output node 50 that depends upon the variable impedance 32.

FIG. 1 illustrates one of many possible examples of an apparatus 10.

In this example, the apparatus 10 comprises a capacitance touch sensor arrangement 20, a variable impedance sensor 30, a switch 40 and an output node 50.

The capacitance touch sensor arrangement 20 is configured to have a variable capacitance 22 that varies when a conductive object 2 approaches.

The capacitance touch sensor arrangement 20 therefore has an electrical characteristic (capacitance) that varies as the object 2 approaches. This electrical characteristic may be measured by a detector 100 attached to the output node 50. The detector 100 is configured to use this measurement to detect when the object 2 is close to or touching the apparatus 10.

The variable impedance sensor 30 is configured to have a variable impedance 32 that varies with a sensed parameter p. The variable impedance sensor 30 therefore has an electrical characteristic (impedance) that is dependent upon the presence of the sensed parameter p. This electrical characteristic may be measured by a detector 100 attached to the output node 50. The detector 100 is configured to use this measurement to detect the presence of the sensed parameter p.

The switch 40 is configured to switch between a first configuration 41 and a second configuration 42.

In the first configuration 41, the detector 100 is able to detect the variable capacitance 22 and in the second configuration the detector 100 is able to detect the variable impedance 32.

The switch 40, in the first configuration 41, provides an output impedance at the output node 50 that depends upon the variable capacitance 22.

The switch 40, in the second configuration 42, provides an output impedance at the output node 50 that depends upon the variable impedance 32.

In some but not necessarily all examples, the output impedance at the output node 50, when the switch 40 is in the first configuration 41, depends predominantly or solely upon the variable capacitance 22.

In some but not necessarily all example, the output impedance at the output node 50, when the switch 40 is in the second configuration 42, depends predominantly or solely upon the variable impedance 32.

FIG. 2 illustrates one of many possible examples of the apparatus 10.

In this example, as in the example of FIG. 1, the apparatus 10 comprises a capacitance touch sensor arrangement 20, a variable impedance sensor 30, a switch 40 and an output node 50. The description of these components and their operation given with respect to FIG. 1 is also applicable to FIG. 2.

In FIG. 2, the capacitance touch sensor arrangement 20 comprises a first electrode 61 arranged to provide at least some of the variable capacitance 22 with respect to the conductive object 2.

FIG. 3A, illustrates schematically the apparatus 10 when the switch 40 is in the first configuration 41. The first electrode 61 is connected to the output node 50 via a low impedance path 63.

FIG. 3B, illustrates schematically the apparatus 10 when the switch 40 is in the second configuration 42. The variable impedance 32 is, instead, connected to the output node 50.

In the apparatus 10, illustrated in FIG. 2, a second electrode 62 is connected between the switch 40 and the output node 50.

FIG. 4 illustrates one of many possible examples of the apparatus 10. In this example, as in the example of FIGS. 1 and 2, the apparatus 10 comprises a capacitance touch sensor arrangement 20, a variable impedance sensor 30, a switch 40 and an output node 50. In this example, as in the example of FIG. 2, the apparatus 10 comprises a first electrode 61 and a second electrode 62. The description of these components and their operation given with respect to FIG. 1, FIG. 2 and FIGS. 3A and 3B is also applicable to FIG. 4.

In the apparatus 10, illustrated in FIG. 4 the first electrode 61 is a first electrode of the variable capacitance 22 and also a first electrode of the variable impedance 32. The second electrode 62, connected in electrical series to the output node 50, is a second electrode of the variable capacitance 22 and also a second electrode 62 of the variable impedance 32. The variable impedance 32 is the impedance between the first electrode 61 and the second electrode 62.

The switch 40, when it changes from the second configuration 42 to the first configuration 41, creates a low impedance current path in parallel to the variable impedance 32 between the first electrode 61 and the second electrode 62.

In the illustrated example, the switch 40 is used to open/close a bypass circuit that is in electrical parallel to the variable impedance sensor 30 and between the first and second electrodes 61, 62.

In the first configuration 41, the switch is closed to interconnect the first electrode 61 and the second electrode in electrical series via a low impedance current path through the switch 40. This current path provides an alternative lower impedance current path compared to the current path through the variable impedance 32. The lowest impedance path is therefore via the switch 40 rather than through the variable impedance sensor 30 and the impedance between the first electrode 61 and the second electrode 62 is reduced when the switch switches to the first configuration 41.

The first electrode 61 and the second electrode 62 together provide the variable capacitance 22 with respect to a proximal conductive object 2. The first electrode 61 forms a first capacitor with the conductive object 2 and the second electrode 62 forms a second capacitor with the second electrode. The first capacitor and the second capacitor are in parallel, so if the first capacitor has a variable capacitance C1 and the second capacitor has a variable capacitance C2, then the variable capacitance 22 is the sum of C1 and C2.

In the second configuration 42, the switch 40 is open disconnecting the low impedance current path between the first electrode 61 and the second electrode 62. The lowest impedance path between the first electrode 61 and the second electrode is now via the variable impedance sensor 30.

The switch 40 in the second configuration 42 may connect the first electrode 61 to a reference node 64 (e.g. earth) via a low impedance current path.

The output node 50 sees as its output impedance the variable impedance 32 (if a conductive object 2 is not close) or (if a conductive object 2 is close) it sees the variable impedance 32 in parallel with the second capacitor formed between the second electrode 62 and the conductive object 2.

It may therefore be preferable for the variable capacitance C2 of the second capacitor to be small, so that the output impedance at the output node 50, when the switch 40 is in the second configuration, is dominated by the variable impedance 22 and is not strongly dependent upon the presence or location of a conductive object 2. The second electrode 62 may, for example, have a small area.

FIG. 5 illustrates one of many possible examples of the apparatus 10. In this example, as in the example of FIG. 4, the apparatus 10 comprises a capacitance touch sensor arrangement 20, a variable impedance sensor 30, a switch 40 and an output node 50. In this example, as in the example of FIG. 4, the apparatus 10 comprises a first electrode 61 and a second electrode 62. The description of these components and their operation given with respect to FIG. 1, FIG. 2, FIGS. 3A and 3B and FIG. 4 is also applicable to FIG. 5.

In the apparatus 10, illustrated in FIG. 5 the variable impedance sensor 30 is a capacitor 72 formed between the first electrode 61 and the second electrode 62.

A capacitor dielectric 70 is positioned between the first electrode 61 and the second electrode 62

The variable impedance 32 may be a variable capacitance dependent upon the capacitor dielectric 70.

The relative permittivity of the dielectric 70 is dependent upon a sensed parameter p. Presence of the sensed parameter changes the relative permittivity of the dielectric 70, which changes the capacitance of the capacitor 72.

For example, the sensed parameter p may be humidity. The capacitor dielectric 70 is formed from a material whose dielectric constant changes with relative humidity. Suitable materials include polymers such as polyimide. A route for the humidity to reach the capacitor dielectric 70 should also be provided.

For example, the sensed parameter p may be temperature. The capacitor dielectric 70 is formed from a material whose dielectric constant changes with temperature. Suitable materials include polytetrafluoroethylene (PTFE).

Alternatively, or in addition, the variable impedance 32 may be a variable capacitance dependent upon a variable separation between the first electrode 61 and the second electrode 62. The variable separation is dependent upon a sensed parameter p. Presence of the sensed parameter p changes the separation, which changes the capacitance of the capacitor 72.

For example, the sensed parameter p may be pressure, force, strain, or displacement. The material used for the capacitor dielectric 70 may have an elasticity (Young's modulus) suitable for its purpose.

Figure 7A:
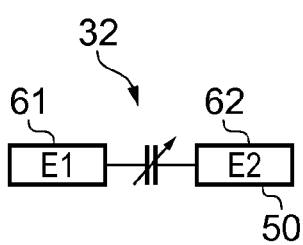
FIG. 7A illustrates an equivalent circuit for the multi-function sensing apparatus of FIG. 5 when the switch is in the second configuration and a conductive object 2 is not near.
Figure 7B:
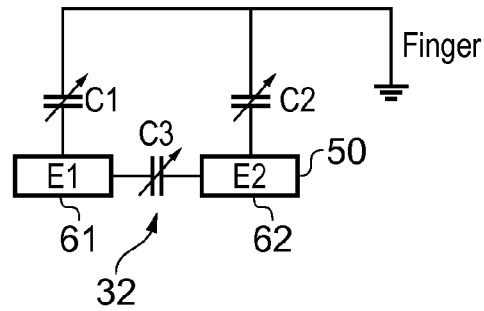
FIG. 7B illustrates an equivalent circuit for the multi-function sensing apparatus of FIG. 5 when the switch is in the second configuration and a conductive object 2 is near.

FIGS. 7A and 7B illustrate equivalent circuits for the apparatus 10 of FIG. 5 when the switch is in the second configuration and when a conductive object 2 is not close (FIG. 7A) and when a conductive object 2 (e.g. a user's finger) is close (FIG. 7B).

When a conductive object 2 is not close (FIG. 7A), the output node 50 sees as its output impedance the variable impedance 32

When a conductive object is close (FIG. 7B), the first electrode 61 forms a first capacitor with the conductive object 2 and the second electrode 62 forms a second capacitor with the second electrode. The first capacitor has a variable capacitance C1, the second capacitor has a variable capacitance C2, and the capacitor 72 has a variable capacitance C3.

If the switch 40 connects to a reference node 64, then the first electrode 61 is grounded and the output node 50 sees as its output impedance the capacitance C3 in parallel with the capacitance C2.

It may therefore be preferable for the variable capacitance C2 of the second capacitor to be small, so that the output impedance at the output node 50, when the switch 40 is in the second configuration 42, is dominated by the capacitance C3 and is not strongly dependent upon the presence or location of a conductive object 2. The second electrode 62 may, for example, have a small area or be positioned further from where the conductive object 2 may be located.

If the switch 40 is free floating and does not connect to a reference node 64, then the first electrode 61 is not grounded and the output node 50 sees as its output impedance the capacitance C2 in parallel with the series capacitances C1 and C3.

It may therefore be preferable for the variable capacitance C1 of the first capacitor and the capacitance C2 of the second capacitor to both be significantly smaller, for example at least one or two orders of magnitude smaller, than the capacitance C3 of the capacitor 72.

Figure 6:
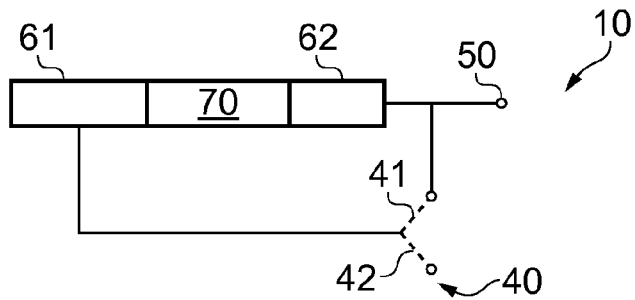
FIG. 6 illustrates an example of the multi-function sensing apparatus illustrated in FIG. 5.

FIG. 6 illustrates an example of the apparatus 10 illustrated in FIG. 5.

The first electrode 61 opposes the second electrode 62 across a gap occupied by dielectric 70.

The switch 40 when in the first configuration 41 connects the first electrode 61 to the second electrode 62.

The switch 40 when in the second configuration 42 connects the first electrode 61 to a reference node or leaves it floating.

Figure 8A:
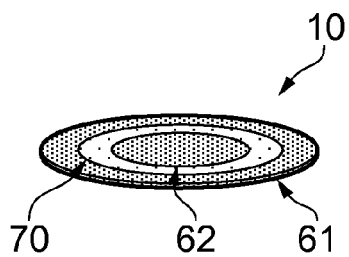
FIG. 8A illustrates the an example of the multi-function sensing apparatus of FIG. 7 that has a planar configuration.

FIG. 8A illustrates the apparatus 10 of FIG. 7 in a planar configuration.

The first electrode 6, the dielectric 70 and the second electrode 62 extend over the same plane. The area of the second electrode 62 adjacent the dielectric 70 is significantly smaller than the area of the first electrode 61 adjacent the dielectric 70.

In the illustrated example, the second electrode 62 is centrally located with the first electrode 61 arranged as a circumscribing ring electrode.

Figure 8B:
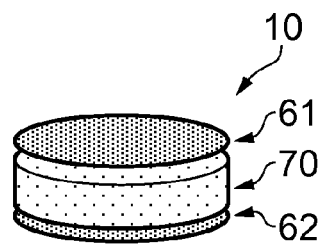
FIG. 8B illustrates the an example of the multi-function sensing apparatus of FIG. 7 that has a stacked configuration.

FIG. 8B illustrates the apparatus 10 of FIG. 7 in a stacked configuration.

The first electrode 6, the dielectric 70 and the second electrode 62 extend over different planes.

In this example, the second electrode 62 is at the bottom of the stack and the first electrode 61 is at the top of the stack. The first electrode 61 will therefore couple more strongly with proximal conductive objects 2.

Figure 9:
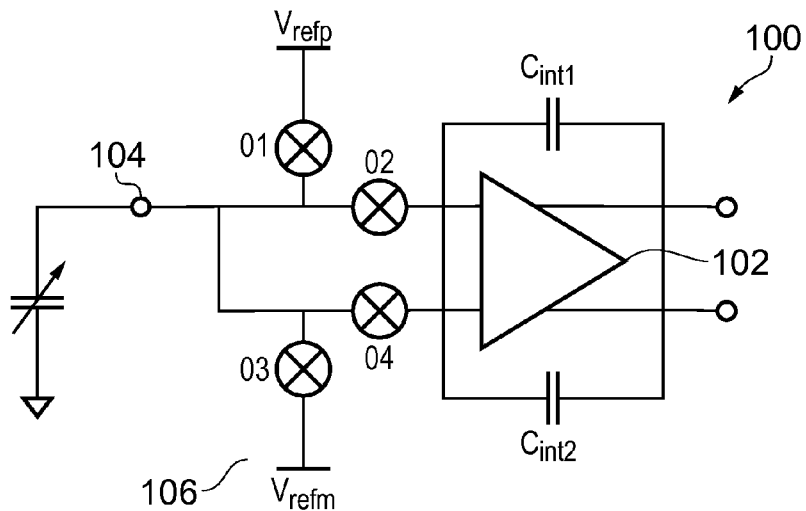
FIG. 9 illustrates an example of a detector.

FIG. 9 illustrates an example of a detector 100 suitable for use with the apparatus 10 illustrated in FIG. 5, 7 or 8.

A reference voltage 106 is applied to both the inverting and non-inverting inputs of an operational amplifier 102.

The input node 104 is connected to the output node 50 of the apparatus 10. The input node 104 provides the voltage associated with the variable capacitance being sensed (C1+C2 in the first configuration, C3 in the second configuration) to the non-inverting input of the operational amplifier. The output of the operational amplifier 102 is therefore indicative of the voltage input at the input node 104 which is dependent upon the sensed capacitance.

Figure 10:
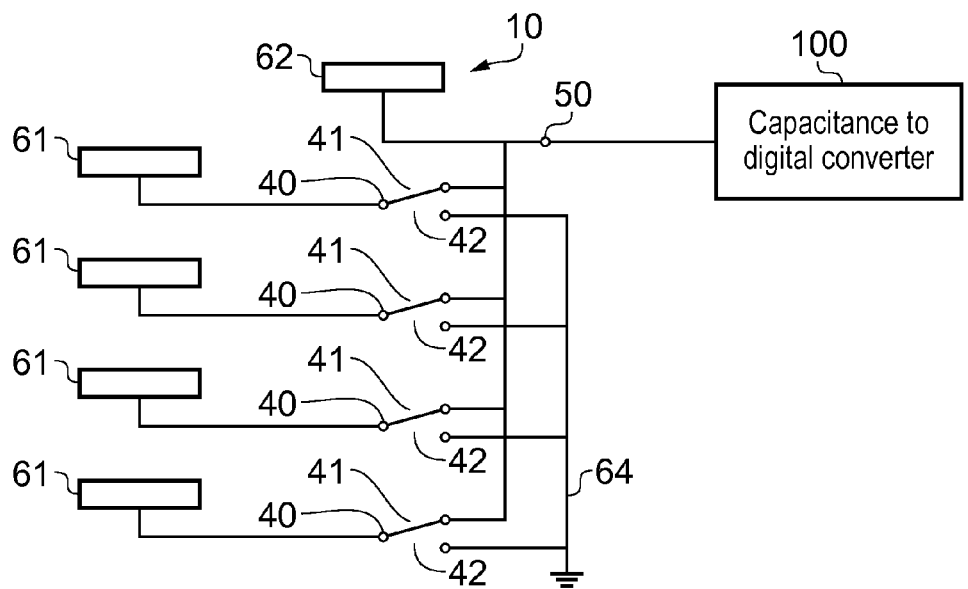
FIG. 10 illustrates an example of a multi-function sensing apparatus.

FIG. 10 illustrates an apparatus 10 similar to any of the previously described apparatus 10.

The apparatus 10 in FIG. 10 is similar to the apparatus 10 in FIGS. 5 and 6, and the description provided above in relation to FIGS. 5 and 6 is also relevant to the apparatus 10 illustrated in FIG. 10.

The apparatus 10 illustrated in FIG. 10, however, comprises a plurality of first electrodes 61 each of which is associated with its own switch 40 configured to switch 40 between a first configuration 41 and a second configuration 42.

The apparatus 10 comprises a single second electrode 62 configured to provide an output signal at an output node 50.

When a switch 40 switches from the second configuration 42 to the first configuration, it provides a lower impedance current path between the first electrode 61 associated with the switch 40 and the second electrode 62 by interconnecting that first electrode 61 and the second electrode 62.

When the switch 40 is in the first configuration 41, the first electrode 61 associated with that switch 40 and the second electrode 62 form a capacitance touch sensor arrangement 20 configured to have a variable capacitance 22 that varies when a conductive object 2 approaches.

When the switch 40 is in the second configuration 42, the first electrode 61 associated with that switch 40 and the second electrode 62 form a variable impedance sensor 30 configured to have a variable impedance 32 that varies with a sensed parameter p.

Each first electrode 61 and the second electrode 62 form a variable impedance 32 that varies with a particular parameter p. In the illustrated example, each first electrode 61 and the second electrode 62 form a capacitor with a dielectric with a relative permittivity that varies with a particular parameter p.

Each pairing of second electrode 62 and particular first electrode 61, forms a particular arrangement comprising: a capacitance touch sensor arrangement 20 configured to have a variable capacitance 22 that varies when a user finger touches the capacitance touch sensor arrangement 20; and a variable impedance sensor 30 configured to have a variable impedance 32 that varies with a sensed parameter p; and an associated switch 40 configured to provide, in a first configuration, an output impedance that depends upon the variable capacitance 22 and configured to provide, in a second configuration, an output impedance that depends upon the variable impedance 32.

The arrangements are connected in parallel—the second electrode 62 being common to all arrangements. Each of the switches 40 in the first configuration 41 connect their associated first electrodes 61 to the second electrode 62 which operates as a common output node 50.

When all of the switches 40 are in the first configuration 41, the apparatus 10 is optimized for detection of a proximal object 2. To read a particular impedance sensor 30, the switch 40 associated with that particular impedance sensor 30 is changed from the first configuration 41 to the second configuration 42. One impedance sensor 30 may be read at a time or alternatively multiple impedance sensors 30 may be read at the same time.

In some but not necessarily all embodiments, different ones of the plurality of arrangements comprise different variable impedance sensors 30 each configured to have a variable impedance 32 that varies with a different sensed parameter p. The apparatus 10 is configured to sense a particular parameter p by switching the one or more switches associated with the one or more variable impedance sensors 30 for that parameter p to a second configuration 42.

Figure 11:
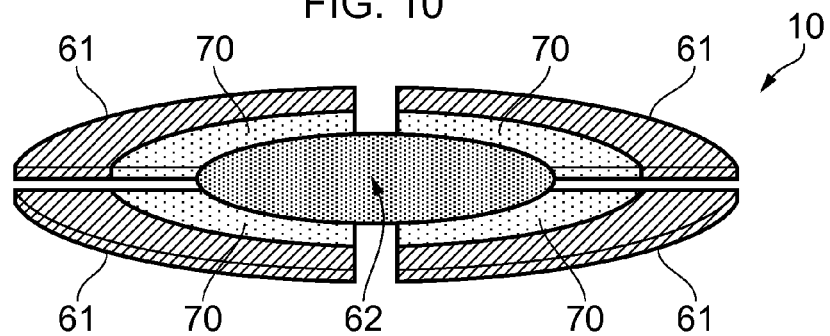
FIG. 11 illustrates an example of the multi-function sensing apparatus of FIG. 10.

FIG. 11 illustrates the apparatus 10 of FIG. 10 in a planar configuration.

The first electrodes 61, the dielectric 70 and the common second electrode 62 extend over the same plane. Each of the first electrodes 61 has its own dielectric 70. The area of the second electrode 62 adjacent a dielectric 70 is significantly smaller than the area of the first electrode 61 adjacent the dielectric 70.

In the illustrated example, the second electrode 62 is centrally located with the first electrodes 61 arranged as a group of separate electrodes that in combination surround the second electrode 62.

In some but not necessarily all embodiments, each of the first electrodes may be associated with the same dielectric. The variable impedance sensors 30 therefore sense the same parameter p but at different locations. This may allow the sensing of a stimulus location or orientation (e.g. axis of strain).

In some but not necessarily all embodiments, each of the first electrodes may be associated with a different dielectric. The variable impedance sensors 30 therefore sense the different parameters p.

In the foregoing description reference has been made to the switching of switch(es) 40 between a first configuration 41 and a second configuration 42.

Circuitry may be provided as part of the apparatus 10 or separately to the apparatus 10, that is configured to provide control signals that control the configuration of the switch(es) 40. For example, the detector 100 may be configured to provide switch control signals that control the configuration of the switch(es) 40.

In the preceding embodiments, the switches 30 have a first configuration 41 and a second configuration 42.

In the first configuration 41, the first electrode 61 and second electrode 62 are interconnected, short-circuiting the variable impedance 32. Either the first electrode 61 or the second electrode 62 may be used as an output node 50.

In the second configuration 42, the first electrode 61 is connected to a reference node 64 via the switch 40 and the second electrode 62 is used as an output node 50.

In the following embodiment, the switch(es) 30 have an additional third configuration.

The third configuration is similar to the second configuration. However, in the third configuration, the second electrode 62 (not the first electrode 61) is connected to a reference node via the switch 40 and the first electrode 61 (not the second electrode 62) is used as an output node.

A measurement of only the variable impedance 32 may be determined by:

a) measuring the output impedance $Z_1$ at the first or second electrode 61, 62 when the switch 40 is in the first configuration, b) measuring the output impedance $Z_{22}$ at the second electrode 62 when the switch 40 is in the second configuration (and the first electrode is connected to a reference node); and c) measuring the output impedance $Z_{21}$ at the first electrode 61 when the switch 40 is in the third configuration similar to the second configuration except that the second electrode 62, not the first electrode 61, is connected to a reference node.

The variable impedance 32 is given by $[½(Z_{21}^{-1}+Z_{22}^{-1}-Z_1^{-1})]^{-1}$.

If first capacitor formed by the first electrode 61 has impedance z1, the second capacitor formed by the second electrode 62 has impedance z2 and the variable impedance 32 has impedance z3, then $$[1/2(Z_{21} + Z_{22} - Z_1)]^{-1} = \left[1/2\left\{\begin{array}{l}(z1 // z3)^{-1} + \\ (z2 // z3)^{-1} - \\ (z1 // z2)^{-1}\end{array}\right\}\right]^{-1}$$

$$= \left[1/2\left(\begin{array}{l}1/z1 + 1/z3 + \\ 1/z2 + 1/z3 - 1/z1 - 1/z2\end{array}\right)\right]^{-1}$$

$$= z3$$

However, in a typical arrangement z3<<z1, z3<<z2, so $Z_{21}$ approximates to z3.

As used here 'module' refers to a unit or apparatus that excludes certain parts/components that would be added by an end manufacturer or a user. The apparatus 10 may be a module.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a capacitance touch sensor arrangement having a variable capacitance, said variable capacitance being dependent upon a proximity of a conductive object;
   at least one variable impedance sensor, the at least one variable impedance sensor having a variable impedance, said variable impedance being dependent upon a sensed parameter not related to the proximity of the conductive object;
   an output node;
   and
   at least one switch connecting, in a first configuration, the output node to the capacitance touch sensor arrangement and connecting, in a second configuration, the output node to the at least one variable impedance sensor.

2. The apparatus as claimed in claim 1, wherein the at least one switch connects, in the first configuration, a first electrode to the output node via a low impedance path.

3. The apparatus as claimed in claim 1, wherein the at least one switch connects, in the second configuration, the at least one variable impedance sensor between a reference node and the output node.

4. The apparatus as claimed in claim 1, wherein the at least one switch reduces, in the first configuration, an impedance between a first electrode and a second electrode.

5. The apparatus as claimed in claim 1, wherein the at least one switch interconnects, in the first configuration, a first electrode and a second electrode.

6. The apparatus as claimed in claim 5, wherein the at least one switch interconnects, in the first configuration, the first electrode and the second electrode in electrical series via a low impedance current path through the at least one switch to provide an alternative to a current path through the at least one variable impedance sensor.

7. The apparatus as claimed in claim 1, wherein in the first configuration, the lowest impedance path between the first electrode and the second electrode is via the at least one switch and not via the at least one variable impedance sensor.

8. The apparatus as claimed in claim 1, wherein, in the second configuration, the lowest impedance current path between a first electrode and a second electrode is via the at least one variable impedance sensor.

9. The apparatus as claimed in claim 1, wherein the apparatus further comprises a first electrode, the first electrode being a first electrode of the capacitance touch sensor arrangement and being a first electrode of the at least one variable impedance sensor.

10. The apparatus as claimed in claim 9, wherein the apparatus further comprises a second electrode connected in electrical series to the output node, said second electrode being a second electrode of the capacitance touch sensor arrangement and being a second electrode of the at least one variable impedance sensor.

11. The apparatus as claimed in claim 10, wherein the at least one switch provides, in the first configuration, a low impedance current path between the first and second electrodes in parallel to the at least one variable impedance sensor.

12. The apparatus as claimed in claim 11, wherein the at least one switch, in the second configuration, connects the first electrode to a reference node via a low impedance current path.

13. An apparatus comprising:
    a first electrode;
    a second electrode, said second electrode providing an output signal; and
    a switch having a first configuration and a second configuration between said first electrode and said second electrode, an impedance between the first electrode and the second electrode being lower in the first configuration than in the second configuration,
    wherein, in the first configuration, the first and second electrodes form a capacitance touch sensor arrangement having a variable capacitance, said variable capacitance being dependent upon a proximity of a conductive object, and
    wherein, in the second configuration, the first and second electrodes form a variable impedance sensor having a variable impedance, said variable impedance being dependent upon a sensed parameter not related to the proximity of the conductive object.

14. The apparatus as claimed in claim 13, wherein the switch, in the first configuration, provides a low impedance current path between the first electrode and the second electrode.

15. The apparatus as claimed in claim 13, wherein the switch, in the first configuration, interconnects the first electrode and the second electrode.

16. The apparatus as claimed in claim 13, wherein the first electrode and the second electrode form a capacitor, said capacitor including a dielectric having a relative permittivity varying with a particular parameter.

17. The apparatus as claimed in claim 13, further comprising a control circuitry for controlling the switch.

18. The apparatus as claimed in claim 13, further comprising a detection circuitry for detecting the output signal.

19. The apparatus as claimed in claim 17, wherein the control circuitry causes the output signal to depend, in the first configuration, upon the capacitance touch sensor arrangement and, in the second configuration, upon the variable impedance sensor.

* * * * *